(12) United States Patent
Wada et al.

(10) Patent No.: US 6,977,604 B2
(45) Date of Patent: Dec. 20, 2005

(54) ANALOG-TO-DIGITAL CONVERTER CYCLICALLY REPEATING AD CONVERSION

(75) Inventors: Atsushi Wada, Ogaki (JP); Shigeto Kobayashi, Gifu (JP); Kuniyuki Tani, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/950,569

(22) Filed: Sep. 28, 2004

(65) Prior Publication Data

US 2005/0068220 A1    Mar. 31, 2005

(30) Foreign Application Priority Data

Sep. 29, 2003    (JP) ............................. 2003-338610

(51) Int. Cl.[7] .............................................. H03M 1/12
(52) U.S. Cl. ...................... 341/155; 341/126; 341/156
(58) Field of Search ................................. 341/155, 156, 341/118, 120, 126, 110, 144, 145, 161, 162

(56) References Cited

U.S. PATENT DOCUMENTS 5,159,342 A * 10/1992 Yotsuyanagi ................ 341/161
6,195,032 B1 * 2/2001 Watson et al. ............... 341/162
6,304,206 B1 * 10/2001 Wada et al. .................. 341/162
6,683,554 B2 * 1/2004 Nikai et al. .................. 341/161
6,859,158 B2 * 2/2005 Wada et al. .................. 341/155

FOREIGN PATENT DOCUMENTS

JP    11-145830    5/1999

* cited by examiner

*Primary Examiner*—John B Nguyen
(74) *Attorney, Agent, or Firm*—McDermott Will & Emery LLP (57) ABSTRACT

An AD converter capable of achieving both an improved processing speed and a reduced circuit area in good balance. The AD converter pipelines analog-to-digital conversion by using a two-stage configuration consisting of a first conversion unit, or the prior stage, and a second conversion unit, or the subsequent stage. The first conversion unit is a conversion unit of noncyclic type. The second conversion unit is a conversion unit of cyclic type. The second conversion unit is given a conversion processing speed higher than that of the first conversion unit so that the second conversion unit performs cyclic processing twice while the first conversion unit performs conversion processing once.

6 Claims, 7 Drawing Sheets

ANALOG-TO-DIGITAL CONVERTER CYCLICALLY REPEATING AD CONVERSION

BACKGROUND OF THE INVENTION

1. Field of the Invention

The invention relates to an analog-to-digital converter. In particular, the invention relates to analog-to-digital conversion technologies of multistage pipelined type and cyclic type.

2. Description of the Related Art

Figure 7:
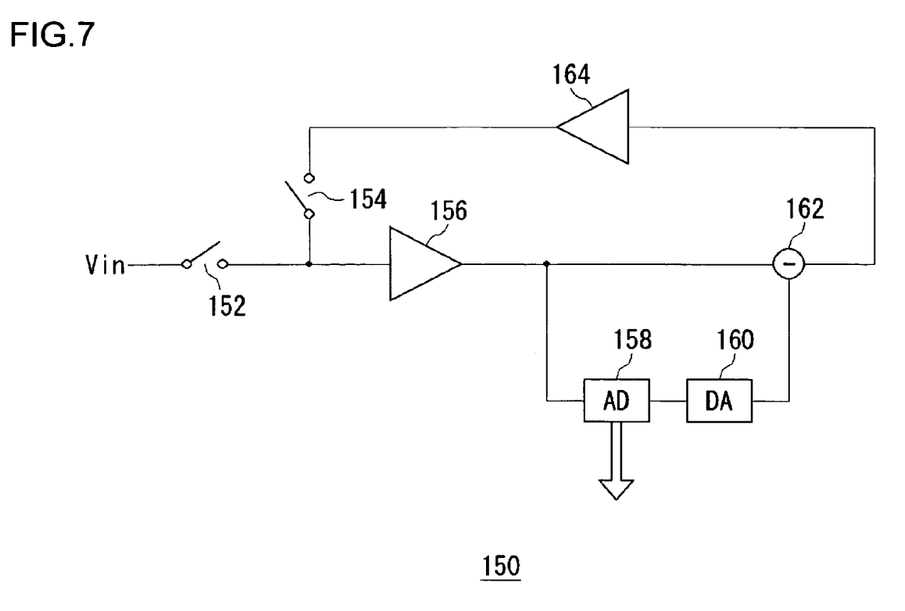
FIG. 7 is a diagram showing the configuration of a conventional cyclic AD converter.

Recently, cellular phones have incorporated a variety of additional functions such as an image capturing function, an image reproducing function, a moving image capturing function, and a moving image reproducing function. Reduced size and reduced power consumption are thus increasingly required of analog-to-digital converters (hereinafter, referred to as "AD converters"). One of the known forms of such AD converters is a cyclic AD converter which has a cyclic configuration (for example, see Japanese Patent Laid-Open Publication No. Hei 11-145830). FIG. 7 shows the configuration of a conventional cyclic AD converter. In this AD converter 150, an analog signal Vin input through a first switch 152 is sampled by a first amplifier circuit 156, and converted into a 1-bit digital value by an AD conversion circuit 158. The digital value is converted into an analog value by a DA conversion circuit 160, and subtracted from the input analog signal Vin by a subtractor circuit 162. The output of the subtractor circuit 162 is amplified by a second amplifier circuit 164, and fed back to the first amplifier circuit 156 through a second switch 154. This feedback-based cyclic processing is repeated 12 times to obtain 12 bits of digital value.

The cyclic AD converter described above is advantageous in suppressing the circuit area since it has a smaller number of elements as compared to multistage pipelined AD converters. For the reduced circuit area, however, an improvement to the conversion processing speed can sometimes be traded off. It has thus been a challenge to AD converters of cyclic type to achieve an efficient configuration that can attain both of these conflicting performances.

SUMMARY OF THE INVENTION

The present invention has been achieved in view of the foregoing. It is thus an object of the present invention to achieve an improved processing speed and a reduced circuit area of the AD converter in good balance.

One of the aspects of the present invention is an analog-to-digital converter. This analog-to-digital converter comprises a plurality of stages of conversion units each including an AD conversion circuit which converts an input analog signal into a predetermined number of bits of digital value, a DA conversion circuit which converts the output of this AD conversion circuit into an analog signal, and a subtractor circuit which subtracts the output of this DA conversion circuit from the input analog signal. The plurality of stages of conversion units process analog-to-digital conversion in respective predetermined bits in succession. At least part of the plurality of stages of conversion units further include a circuit which feeds back the output of the subtractor circuit to the input of the AD conversion circuit, and repeat the feedback-based cyclic processing a predetermined number of times. While the part of the stages convert a first input analog signal, the other of the stages convert a second input signal input at different timing.

The plurality of stages of conversion units divide the analog-to-digital conversion into respective predetermined bits for pipeline processing. The conversion units may have the same configuration as that of conversion units included in a multistage pipelined AD converter, or the same configuration as that of an AD converter of cyclic type. Alternatively, the conversion units may have the configuration in which AD converters of cyclic type are connected into a plurality of stages for pipeline processing.

According to this aspect, at least one of a plurality of stages of conversion units included in a conventional multistage pipelined AD converter is formed as a cyclic type. It is therefore possible to reduce the circuit area than with the conventional multistage pipelined type. In the meantime, since the conversion is distributed among the plurality of stages of conversion units for simultaneous processing, it is possible to improve the conversion speed as compared to conventional cyclic AD converters.

Incidentally, any combinations of the foregoing components, and the components and expressions of the present invention having their methods, apparatuses, systems, and the like replaced mutually are also intended to constitute applicable aspects of the present invention.

According to the present invention, it is possible to achieve an improved processing speed and a reduced circuit area of the AD converter in good balance.

DETAILED DESCRIPTION OF THE INVENTION (First Embodiment)

An AD converter according to the present embodiment pipelines analog-to-digital conversion by using two stages of conversion units. The prior stage is a conversion unit of noncyclic type. The subsequent stage is one of cyclic type.

Figure 1:
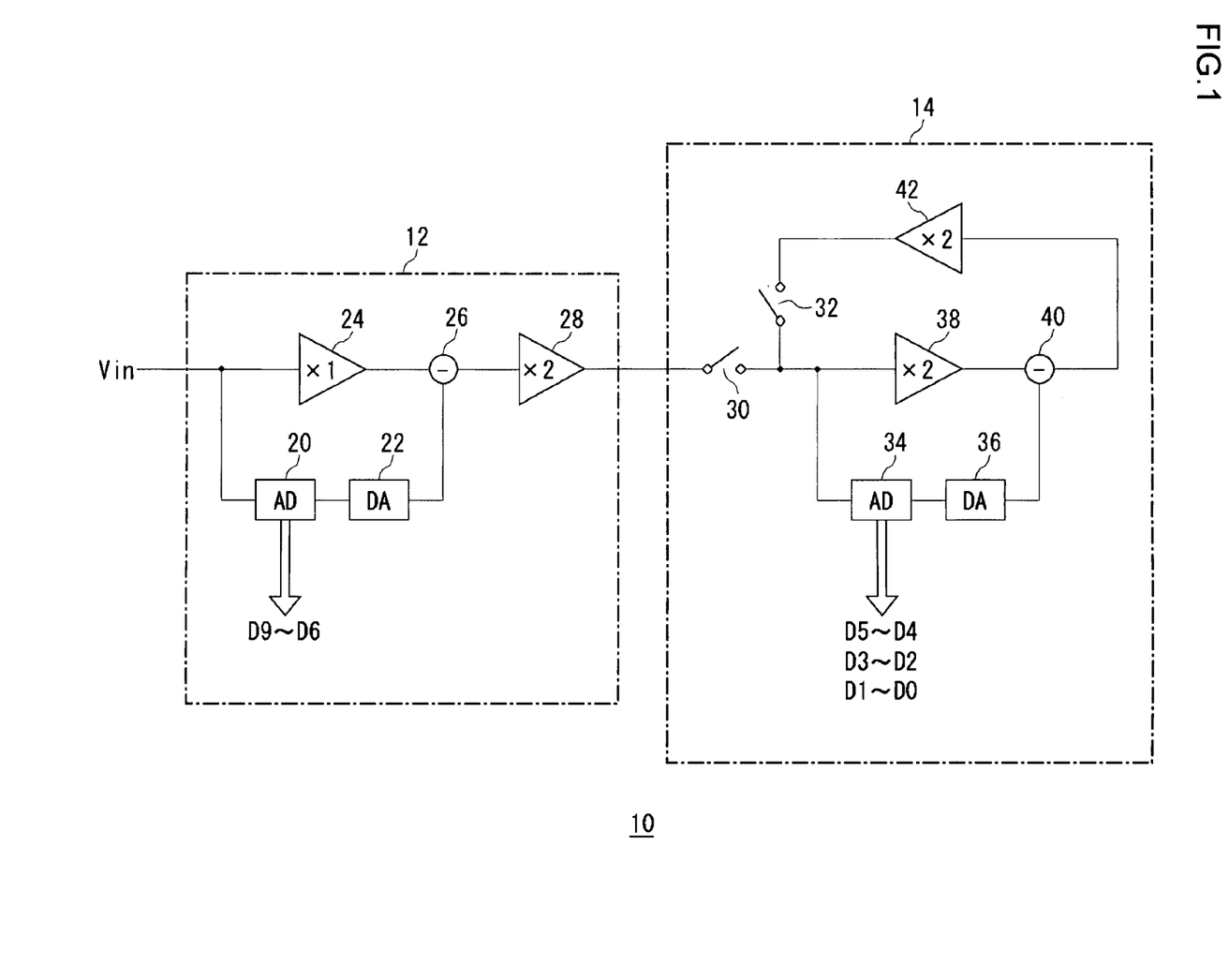
FIG. 1 is a diagram showing the configuration of an AD converter according to a first embodiment.

FIG. 1 shows the configuration of the AD converter according to the first embodiment. The AD converter 10 comprises a first conversion unit 12 and a second conversion unit 14. In the first conversion unit 12 at the prior stage, an input analog signal Vin is input to a first AD conversion circuit 20 and a first amplifier circuit 24. The first AD conversion circuit 20 converts the analog value of the input analog signal Vin into a 4-bit digital value for output. This 4-bit digital value will eventually be corrected digitally into upper four bits (D9–D6) of a 10-bit digital value for the AD converter 10 to generate. The digital value output from the first AD conversion circuit 20 is converted into an analog value by a first DA conversion circuit 22. The first amplifier circuit 24 is a sample-and-hold circuit which samples and holds the input analog signal Vin with a gain of 1. A first subtractor circuit 26 outputs the difference between the analog value output from the first DA conversion circuit 22 and the analog value held in the first amplifier circuit 24. A second amplifier circuit 28 is a circuit which amplifies the output of the first subtractor circuit 26 with a gain of 2.

The analog signal output from the second amplifier circuit 28 is input to the second conversion unit 14 in the subsequent stage as the output of the first conversion unit 12. The analog signal is input to a second AD conversion circuit 34 and a third amplifier circuit 38 through a first switch 30. The second AD conversion circuit 34 converts the value of the input analog signal into a 2-bit digital value for output. The digital value output from the second AD conversion circuit 34 is converted into an analog value by a second DA conversion circuit 36. The third amplifier circuit 38 is a sample-and-hold circuit which samples and holds the input analog signal with a gain of 2. A second subtractor circuit 40 outputs the difference between the analog value output from the second DA conversion circuit 36 and the analog value held in the third amplifier circuit 38. A fourth amplifier circuit 42 is a circuit which amplifies the output of the second subtractor circuit 40 and feeds back the resultant to the second AD conversion circuit 34 and the third amplifier circuit 38, with a gain of 2. The signal amplified by the fourth amplifier circuit 42 is fed back through a second switch 32.

The number of times of the cyclic processing through the feedback of the fourth amplifier circuit 42 is three. When the output of the first conversion unit 12 is initially input to the second conversion unit 14, the first switch 30 is turned on and the second switch 32 off. Then, during circulation, the first switch 30 is turned off and the second switch 32 on. The digital values output from the second AD conversion circuit 34 during circulation eventually make, in descending order, the fifth and sixth bits (D5, D4), the seventh and eighth bits (D3, D2), and the ninth and tenth bits (D1, D0) of the 10-bit digital value for the AD converter 10 to output. As above, the upper four bits out of the ten bits are converted by the first conversion unit 12, or the prior stage. The lower six bits are converted by the second conversion unit 14, or the subsequent stage. The subsequent stage is given a processing speed higher than that of the prior stage. Despite the difference in the amount of processing, the prior and subsequent stages require the same time for conversion. That is, although the processing load on the subsequent stage is higher than on the prior stage, the prior and subsequent stages can perform simultaneous processing in parallel.

Figure 2:
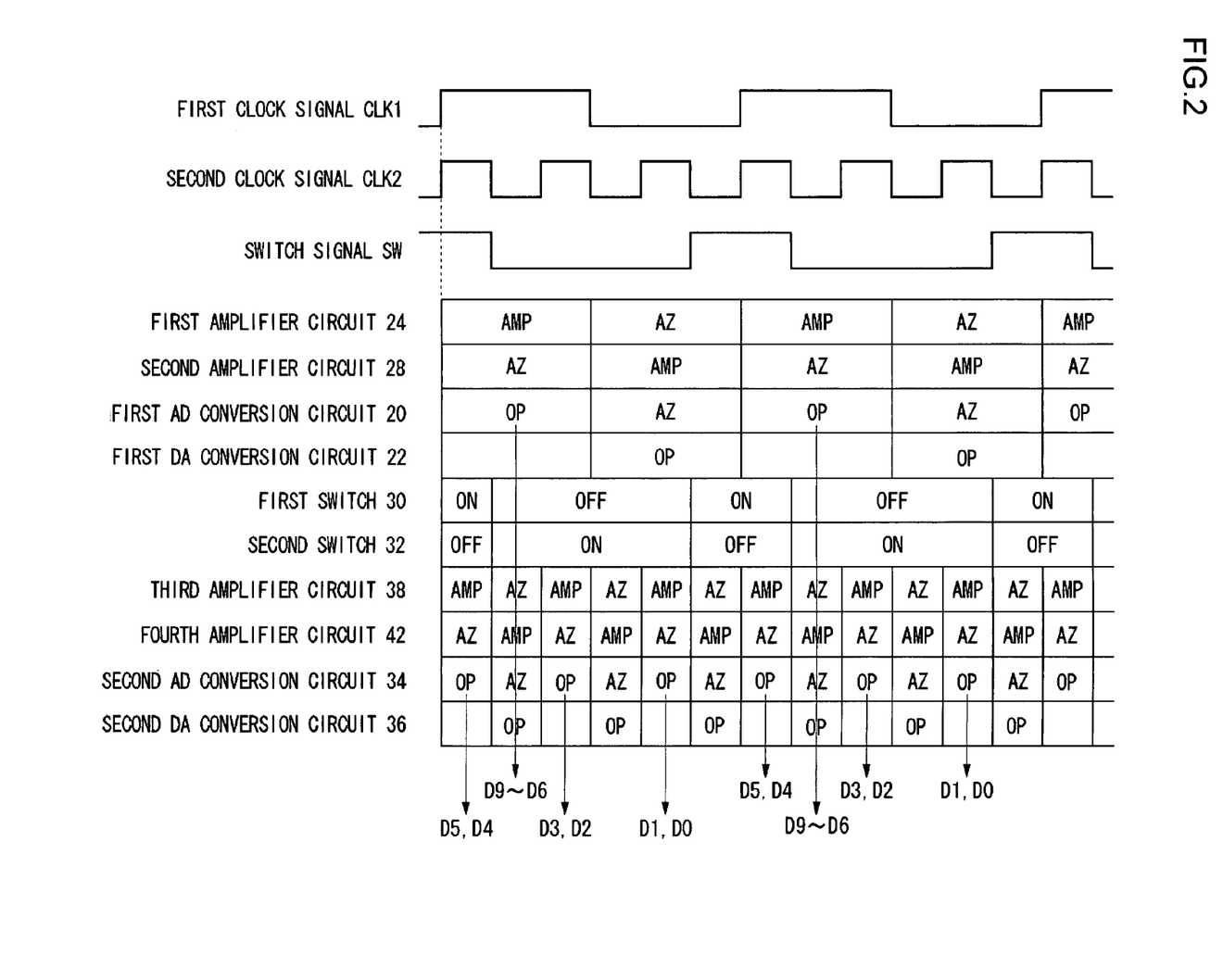
FIG. 2 is a time chart showing the process of operation of the AD converter.

FIG. 2 is a time chart showing the process of operation of the AD converter 10. Hereinafter, description will be given in due course from the top of the chart. The three signal waveforms show a first clock signal CLK1 to be input to the first conversion unit 12, a second clock signal CLK2 to be input to the second conversion unit 14, and a switch signal SW. The second clock signal CLK2 has a frequency three times that of the first clock signal CLK1. The second clock signal CLK2 may be generated by frequency multiplication using a PLL or the like on the basis of the first clock signal CLK1. The second clock signal CLK2 rises in synchronization with a rise of the first clock signal CLK1. Then, the second subsequent fall thereof is in synchronization with the next fall of the first clock signal CLK1. The second subsequent rise thereof is in synchronization with the next rise of the first clock signal CLK1. Since the frequency of the second clock signal CLK2 is three times that of the first clock signal CLK1, the speed of the conversion processing by the second conversion unit 14 is also three times the speed of the conversion processing by the first conversion unit 12. In multistage pipelined AD converters, higher conversion accuracies are required of the prior stages which are in charge of converting the upper bits. In other words, the second conversion unit 14, or the subsequent stage, requires not as high conversion accuracy as the first conversion unit 12 does. The conversion processing speed of the second conversion unit 14 is thus made higher than that of the first conversion unit 12 without particular consideration given to the conversion accuracy.

The switch signal SW controls on/off status of the first switch 30. The inverted signal thereof controls on/off status of the second switch 32. The switch signal SW has a period equal to that of the first clock signal CLK1, and three times that of the second clock signal CLK2. The switch signal SW rises in synchronization with a fall of the second clock signal CLK2, and then falls in synchronization with the next fall of the second clock signal CLK2. The next rise of the switch signal SW is in synchronization with the second subsequent fall of the second clock signal CLK2.

The first amplifier circuit 24 amplifies the input analog signal Vin when the first clock signal CLK1 is high, and makes an auto-zero operation when the first clock signal CLK1 is low. The second amplifier circuit 28 amplifies the output of the first subtractor circuit 26 when the first clock signal CLK1 is low, and makes an auto-zero operation when the first clock signal CLK1 is high. The first AD conversion circuit 20 makes a conversion operation to output the digital values D9 to D6 when the first clock signal CLK1 is high, and makes an auto-zero operation when the first clock signal CLK1 is low. The first DA conversion circuit 22 makes a conversion operation when the first clock signal CLK1 is low, and becomes floating when the first clock signal CLK1 is high.

The first switch 30 is turned on when the switch signal SW is high, and turned off when the switch signal SW is low. The second switch 32 is turned on when the switch signal SW is low, and turned off when the switch signal SW is high. The third amplifier circuit 38 amplifies the input analog signal when the second clock signal CLK2 is high, and makes an auto-zero operation when the second clock signal CLK2 is low. The fourth amplifier circuit 42 amplifies the output of the second subtractor circuit 40 when the second clock signal CLK2 is low, and makes an auto-zero operation when the second clock signal CLK2 is high. The second AD conversion circuit 34 makes a conversion operation when the second clock signal CLK2 is high, and makes an auto-zero operation when the second clock signal CLK2 is low. The second DA conversion circuit 36 makes a conversion operation when the second clock signal CLK2 is low, and becomes floating when the second clock signal CLK2 is high.

As shown in the chart, while the second AD conversion circuit 34 performs conversion processing for D5, D4 and D3, D2, the first AD conversion circuit 20 simultaneously performs conversion processing for an input analog signal Vin that is input next. Through such pipeline processing, the AD converter 10 as a whole can output a 10-bit digital value once per period with reference to the first clock signal CLK1.

As above, according to the present embodiment, the analog-to-digital conversion is pipelined by the conversion unit of noncyclic type and the conversion unit of cyclic type. Besides, the second conversion unit 14, or the subsequent stage, is configured to have a conversion processing speed higher than that of the first conversion unit 12, or the prior stage, while a higher load is imposed on the subsequent stage than on the prior stage. This can improve the overall processing speed as compared to conventional cyclic AD converters which have an identical configuration and conduct conversion at an identical processing speed up to the final stage. In the meantime, the second conversion unit 14, or the subsequent stage, is configured as a cyclic type. It is therefore possible to reduce the circuit area as compared to conventional multistage pipelined AD converters in which all the stages are made of conversion units of noncyclic type.

(Second Embodiment)

As in the first embodiment, the AD converter according to the present embodiment pipelines analog-to-digital conversion by using two stages of conversion units. The present embodiment differs from the first embodiment, however, in that the prior stage and the subsequent stage both are made of conversion units of cyclic type.

Figure 3:
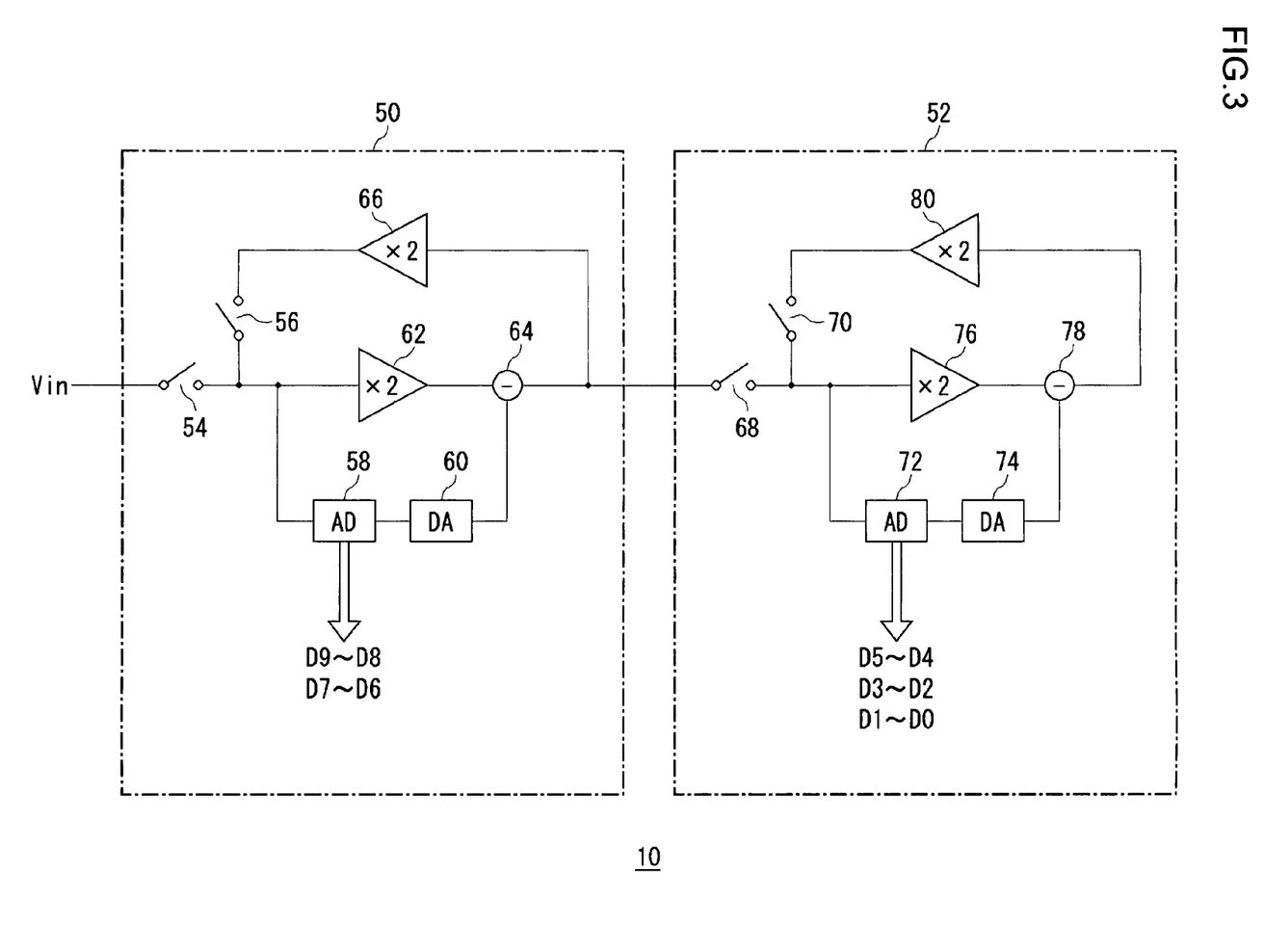
FIG. 3 is a diagram showing the configuration of the AD converter according to a second embodiment.

FIG. 3 shows the configuration of the AD converter according to the second embodiment. The AD converter 10 comprises a first conversion unit 50 and a second conversion unit 52. In the first conversion unit 50 at the prior stage, an input analog signal Vin is input to a first AD conversion circuit 58 and a first amplifier circuit 62 through a first switch 54. The first AD conversion circuit 58 converts the value of the input analog signal into a 2-bit digital value for output. The digital value output from the first AD conversion circuit 58 is converted into an analog value by a first DA conversion circuit 60. The first amplifier circuit 62 is a sample-and-hold circuit which samples and holds the input analog signal with a gain of 2. A first subtractor circuit 64 outputs the difference between the analog value output from the first DA conversion circuit 60 and the analog value held in the first amplifier circuit 62. A second amplifier circuit 66 is a circuit which amplifies the output of the first subtractor circuit 64 and feeds back the resultant to the first AD conversion circuit 58 and the first amplifier circuit 62, with a gain of 2. The signal amplified by the second amplifier circuit 66 is fed back through a second switch 56.

The number of times of the cyclic processing through the feedback of the second amplifier circuit 66 is two. When the input analog signal Vin is initially input to the first conversion unit 50, the first switch 54 is turned on and the second switch 56 off. Then, during circulation, the first switch 54 is turned off and the second switch 56 on. The digital values output from the first AD conversion circuit 58 during circulation eventually make, in descending order, the first and second bits (D9, D8) and the third and fourth bits (D7, D6) of the digital value for the AD converter 10 to output.

The second conversion unit 52 of the subsequent stage receives the analog signal output from the first subtractor circuit 64 as the output of the first conversion unit 50. The analog signal is input to a second AD conversion circuit 72 and a third amplifier circuit 76 through a third switch 68. The second AD conversion circuit 72 converts the value of the input analog signal into a 2-bit digital value for output. The digital value output from the second AD conversion circuit 72 is converted into an analog value by a second DA conversion circuit 74. The third amplifier circuit 76 is a sample-and-hold circuit which samples and holds the input analog signal with a gain of 2. A second subtractor circuit 78 outputs the difference between the analog value output from the second DA conversion circuit 74 and the analog value held in the third amplifier circuit 76. A fourth amplifier circuit 80 is a circuit which amplifies the output of the second subtractor circuit 78 and feeds back the resultant to the second AD conversion circuit 72 and the third amplifier circuit 76, with a gain of 2. The signal amplified by the fourth amplifier circuit 80 is fed back through a fourth switch 70.

The number of times of the cyclic processing through the feedback of the fourth amplifier circuit 80 is three. When the output of the first conversion unit 50 is input to the second conversion unit 52, the third switch 68 is turned on and the fourth switch 70 off. Then, during circulation, the third switch 68 is turned off and the fourth switch 70 on. The digital values output from the second AD conversion circuit 72 during circulation eventually make, in descending order, the fifth and sixth bits (D5, D4), the seventh and eighth bits (D3, D2), and the ninth and tenth bits (D1, D0) of the 10-bit digital value for the AD converter 10 to output. As above, the upper four bits out of the ten bits are converted by the first conversion unit 50, or the prior stage. The lower six bits are converted by the second conversion unit 52, or the subsequent stage. The subsequent stage is given a processing speed higher than that of the prior stage. Despite the difference in the amount of processing, the prior and subsequent stages require the same time for conversion. That is, although the processing load on the subsequent stage is higher than on the prior stage, the prior and subsequent stages can perform simultaneous processing in parallel.

Figure 4:
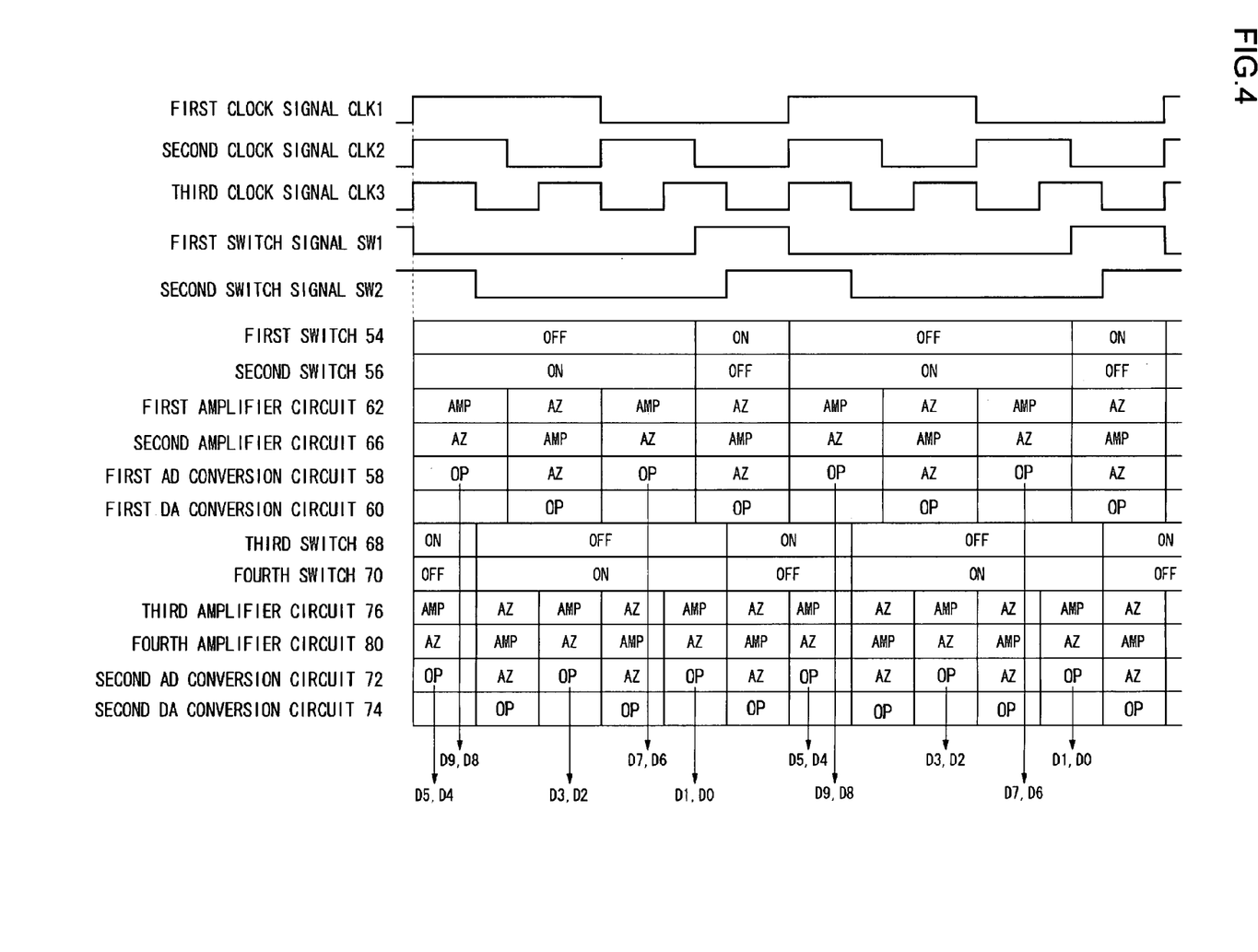
FIG. 4 is a time chart showing the process of operation of the AD converter.

FIG. 4 is a time chart showing the process of operation of the AD converter 10. Hereinafter, description will be given in due course from the top of the chart. The five signal waveforms show a first clock signal CLK1 to be input to the AD converter 10, a second clock signal CLK2 to be input to the first conversion unit 50, a third clock signal CLK3 to be input to the second conversion unit 52, a first switch signal SW1, and a second switch signal SW2. The second clock signal CLK2 has a frequency twice that of the first clock signal CLK1. The third clock signal CLK3 has a frequency three times that of the first clock signal CLK1. The second clock signal CLK2 and the third clock signal CLK3 may be generated by frequency multiplication and division using PLLs or the like on the basis of the first clock signal CLK1, respectively.

As shown in the chart, the second clock signal CLK2 rises in synchronization with a rise of the first clock signal CLK1. Then, the next rise thereof is in synchronization with the next fall of the first clock signal CLK1. The still subsequent rise thereof is in synchronization with the next rise of the first clock signal CLK1. The third clock signal CLK3 rises in synchronization with a rise of the first clock signal CLK1. Then, the second subsequent fall thereof is in synchronization with the next fall of the first clock signal CLK1. The second subsequent rise thereof is in synchronization with the next rise of the first clock signal CLK1. Since the frequency of the third clock signal CLK3 is 1.5 times that of the second clock signal CLK2, the speed of the conversion processing by the second conversion unit 52 is also 1.5 times the speed of the conversion processing by the first conversion unit 50. Even in the present embodiment, the second conversion unit 52, or the subsequent stage, requires not as high conversion accuracy as the first conversion unit 50 does. The conversion processing speed of the second conversion unit 52 is thus made higher than that of the first conversion unit 50.

The first switch signal SW1 controls on/off status of the first switch 54. The inverted signal thereof controls on/off status of the second switch 56. The second switch signal SW2 controls on/off status of the third switch 68. The inverted signal thereof controls on/off status of the fourth switch 70. The first switch signal SW1 and the second switch signal SW2 both have the same periods as that of the first clock signal CLK1. The first switch signal SW1 falls in synchronization with a rise of the second clock signal CLK2. The next rise thereof is in synchronization with the second subsequent fall of the second clock signal CLK2. The second switch signal SW2 falls in synchronization with a fall of the third clock signal CLK3. The next rise thereof is in synchronization with the second subsequent fall of the third clock signal CLK3.

The first switch 54 is turned on when the first switch signal SW1 is high, and turned off when the first switch signal SW1 is low. The second switch 56 is turned on when the first switch signal SW1 is low, and turned off when the first switch signal SW1 is high. The first amplifier circuit 62 amplifies the input analog signal when the second clock signal CLK2 is high, and makes an auto-zero operation when the second clock signal CLK2 is low. The second amplifier circuit 66 amplifies the output of the first subtractor circuit 64 when the second clock signal CLK2 is low, and makes an auto-zero operation when the second clock signal CLK2 is high. The first AD conversion circuit 58 makes a conversion operation when the second clock signal CLK2 is high, and makes an auto-zero operation when the second clock signal CLK2 is low. The first DA conversion circuit 60 makes a conversion operation when the second clock signal CLK2 is low, and becomes floating when the second clock signal CLK2 is high.

The third switch 68 is turned on when the second switch signal SW2 is high, and turned off when the second switch signal SW2 is low. The fourth switch 70 is turned on when the second switch signal SW2 is low, and turned off when the second switch signal SW2 is high. The third amplifier circuit 76 amplifies the input analog signal when the third clock signal CLK3 is high, and makes an auto-zero operation when the third clock signal CLK3 is low. The fourth amplifier circuit 80 amplifies the output of the second subtractor circuit 78 when the third clock signal CLK3 is low, and makes an auto-zero operation when the third clock signal CLK3 is high. The second AD conversion circuit 72 makes a conversion operation when the third clock signal CLK3 is high, and makes an auto-zero operation when the third clock signal CLK3 is low. The second DA conversion circuit 74 makes a conversion operation when the third clock signal CLK3 is low, and becomes floating when the third clock signal CLK3 is high.

As shown in the chart, while the second conversion unit 52 performs conversion processing for D5–D0, the first conversion unit 50 simultaneously performs conversion processing for D9–D6 corresponding to an input analog signal Vin that is input next. Through such pipeline processing, the AD converter 10 as a whole can output a 10-bit digital value at the rate of once per period with reference to the first clock signal CLK1.

As above, according to the present embodiment, analog-to-digital conversion is pipelined by the two stages of conversion units of cyclic type. Moreover, the first conversion unit 50, or the prior stage, performs cyclic processing twice while the second conversion unit 52, or the subsequent stage, performs cyclic processing three times. That is, the subsequent stage is configured to have a conversion processing speed higher than that of the prior stage while a higher processing load is imposed on the subsequent stage than on the prior stage. This can improve the overall processing speed as compared to conventional cyclic AD converters which have an identical configuration and conduct conversion at an identical processing speed up to the final stage. In the meantime, the second conversion unit 52, or the subsequent stage, is configured as a cyclic type. It is therefore possible to reduce the circuit area as compared to conventional multistage pipelined AD converters in which all the stages are made of conversion units of noncyclic type.

(Third Embodiment)

As in the first and second embodiments, an AD converter according to the present embodiment pipelines analog-to-digital conversion by using two stages of conversion units. The present embodiment differs from the first and second embodiments, however, in that the prior stage alone is made of a conversion unit of cyclic type.

Figure 5:
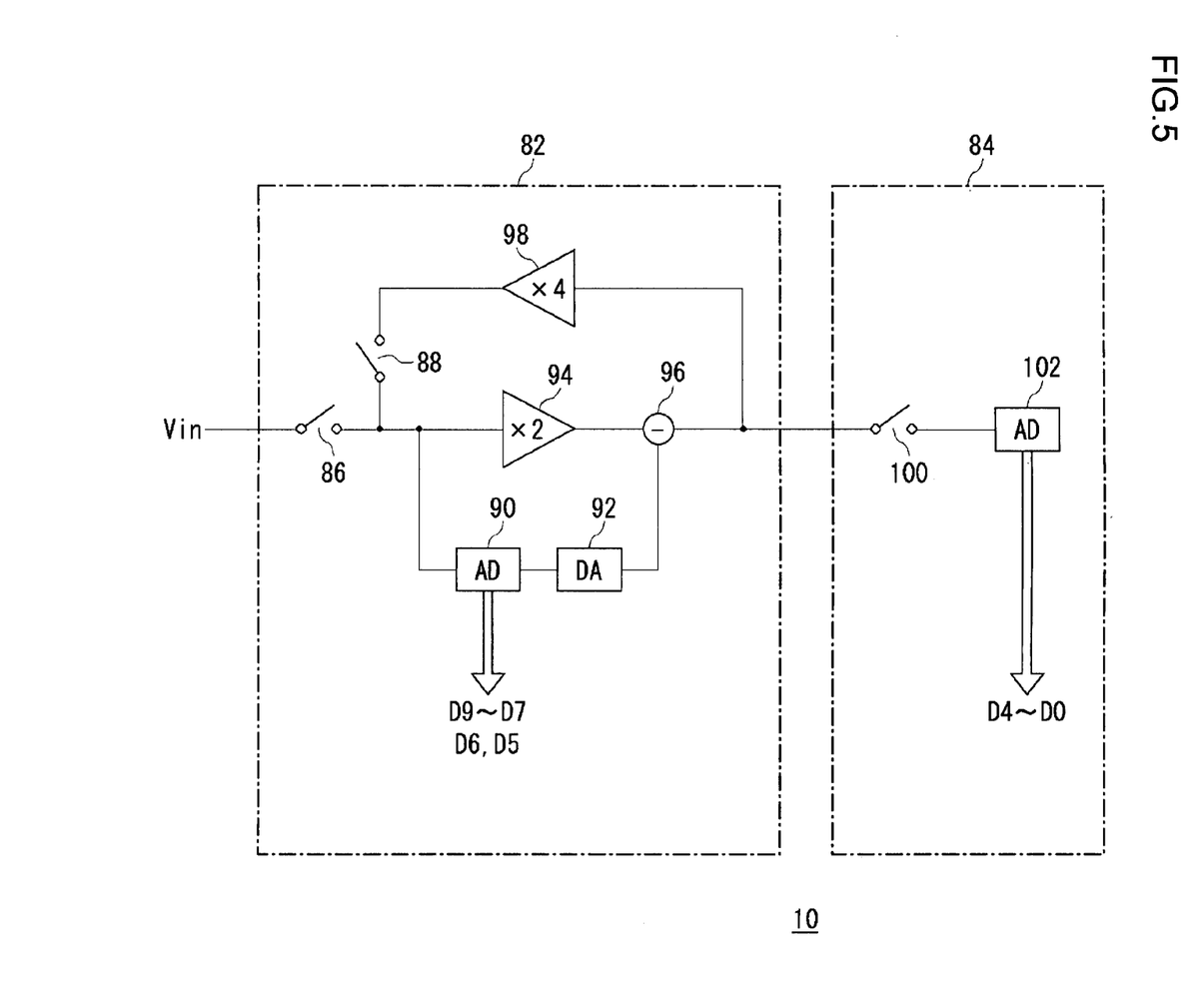
FIG. 5 is a diagram showing the configuration of the AD converter according to a third embodiment.

FIG. 5 shows the configuration of the AD converter according to the third embodiment. The AD converter 10 comprises a first conversion unit 82 and a second conversion unit 84. In the first conversion unit 82 at the prior stage, an input analog signal Vin is input to a first AD conversion circuit 90 and a first amplifier circuit 94 through a first switch 86. The first AD conversion circuit 90 converts the value of the input analog signal into a 3-bit digital value for output. The digital value output from the first AD conversion circuit 90 is converted into an analog value by a DA conversion circuit 92. The first amplifier circuit 94 is a sample-and-hold circuit which samples and holds the input analog signal with a gain of 2. A subtractor circuit 96 outputs the difference between the analog value output from the DA conversion circuit 92 and the analog value held in the first amplifier circuit 94. A second amplifier circuit 98 is a circuit which amplifies the output of the subtractor circuit 96 and feeds back the resultant to the first AD conversion circuit 90 and the first amplifier circuit 94, with a gain of 4. The signal amplified by the second amplifier circuit 98 is fed back through a second switch 88.

The number of times of the cyclic processing through the feedback of the second amplifier circuit 98 is two. When the input analog signal Vin is initially input to the first conversion unit 82, the first switch 86 is turned on and the second switch 88 off. Then, during circulation, the first switch 86 is turned off and the second switch 88 on. In consideration of a redundancy bit, the digital values output from the first AD conversion circuit 90 during circulation eventually make, in descending order, the first to third bits (D9–D7) and the fourth and fifth bits (D6, D5) of the digital value for the AD converter 10 to output.

The second conversion unit 84 at the subsequent stage receives the analog signal output from the subtractor circuit 96 as the output of the first conversion unit 82. The analog signal is input to a second AD conversion circuit 102 through a third switch 100. The second AD conversion circuit 102 converts the value of the input analog signal into a 4-bit digital value for output. The digital value output from the second AD conversion circuit 102 eventually makes, in descending order, the sixth to tenth bits (D4–D0) of the 10-bit digital value for the AD converter 10 to output. As above, the upper five bits out of the ten bits are converted by the first conversion unit 82, or the prior stage, and the lower five bits are converted by the second conversion unit 84, or the subsequent stage. Despite the difference in the amount of processing, the prior stage and the subsequent stage require the same time for conversion. The prior and subsequent stages can thus perform simultaneous processing in parallel.

Figure 6:
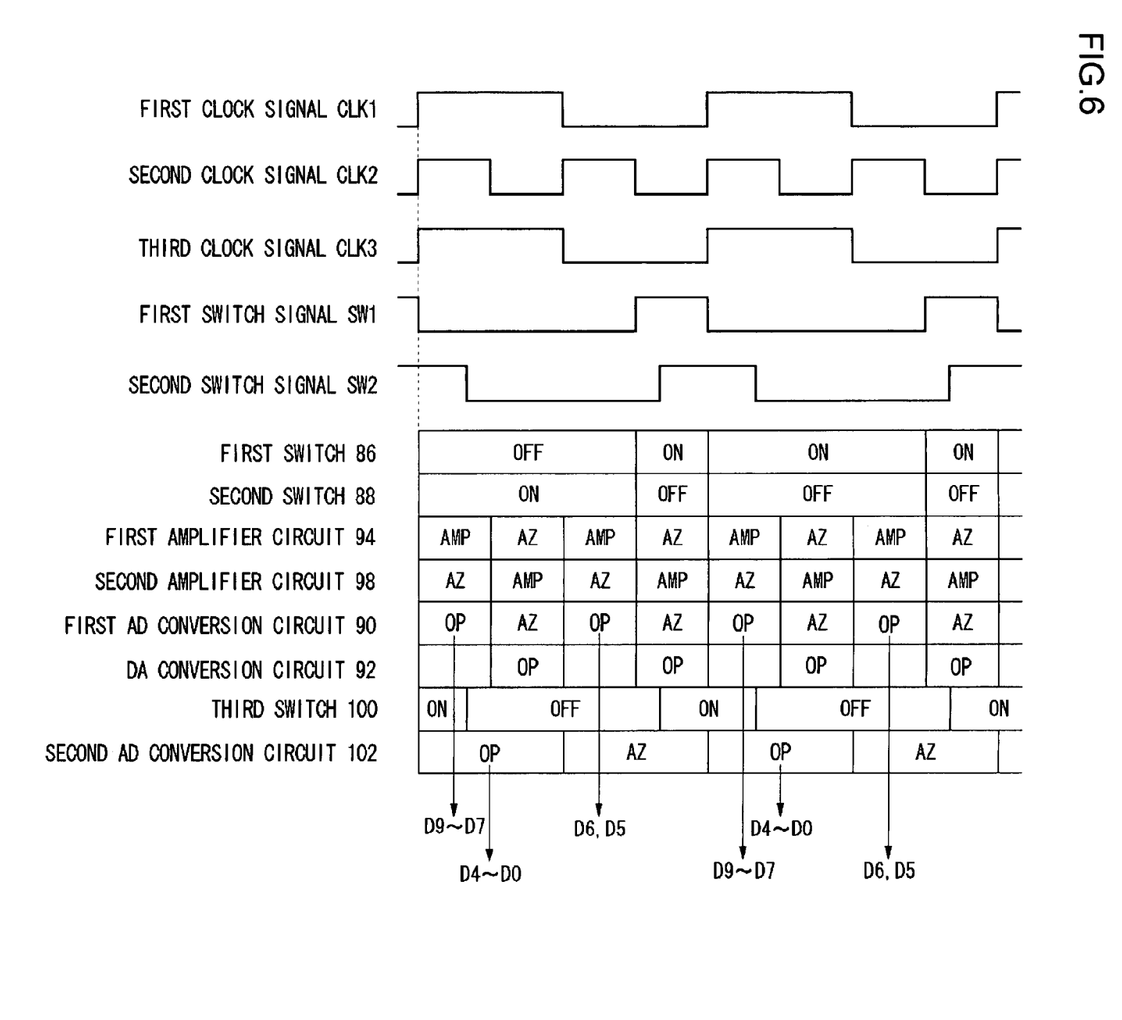
FIG. 6 is a time chart showing the process of operation of the AD converter.

FIG. 6 is a time chart showing the process of operation of the AD converter 10. Hereinafter, description will be given in due course from the top of the chart. The five signal waveforms show a first clock signal CLK1 to be input to the AD converter 10, a second clock signal CLK2 to be input to the first conversion unit 82, a third clock signal CLK3 to be input to the second conversion unit 84, a first switch signal SW1, and a second switch signal SW2, respectively. The second clock signal CLK2 has a frequency twice that of the first clock signal CLK1. It may be generated by frequency multiplication using a PLL or the like on the basis of the first clock signal CLK1. The third clock signal CLK3 has the same frequency as that of the first clock signal CLK1.

As shown in the chart, the second clock signal CLK2 rises in synchronization with a rise of the first clock signal CLK1. Then, the next rise thereof is in synchronization with the next fall of the first clock signal CLK1. The still subsequent rise thereof is in synchronization with the next rise of the first clock signal CLK1. The third clock signal CLK3 traces a waveform identical and synchronous to that of the first clock signal CLK1. In a modified example, however, the frequency of the third clock signal CLK3 may be set higher than that of the first clock signal CLK1. If the third clock signal CLK3 is given a frequency higher than that of the second clock signal CLK2, the second conversion unit 84 exceeds the first conversion unit 84 in conversion processing speed. As in the first and second embodiments, the second conversion unit 84, or the subsequent stage, requires not as high conversion accuracy as the prior stage in charge of converting upper bits does. The conversion processing speed of the second conversion unit 84 can thus be set higher than that of the first conversion unit 82.

The first switch signal SW1 controls on/off status of the first switch 86. The inverted signal thereof controls on/off status of the second switch 88. The second switch signal SW2 controls on/off status of the third switch 100. The first switch signal SW1 and the second switch signal SW2 both have the same periods as that of the first clock signal CLK1. The first switch signal SW1 falls in synchronization with a rise of the second clock signal CLK2. The next rise thereof is in synchronization with the second subsequent fall of the second clock signal CLK2. The second switch signal SW2 has a phase lag such that it rises and falls with some delay after the first switch signal SW1.

The first switch 86 is turned on when the first switch signal SW1 is high, and turned off when the first switch signal SW1 is low. The second switch 88 is turned on when the first switch signal SW1 is low, and turned off when the first switch signal SW1 is high. The first amplifier circuit 94 amplifies the input analog signal when the second clock signal CLK2 is high, and makes an auto-zero operation when the second clock signal CLK2 is low. The second amplifier circuit 98 amplifies the output of the subtractor circuit 96 when the second clock signal CLK2 is low, and makes an auto-zero operation when the second clock signal CLK2 is high. The first AD conversion circuit 90 makes a conversion operation when the second clock signal CLK2 is high, and makes an auto-zero operation when the second clock signal CLK2 is low. The DA conversion circuit 92 makes a conversion operation when the second clock signal CLK2 is low, and becomes floating when the second clock signal CLK2 is high.

The third switch 100 is turned on when the second switch signal SW2 is high, and turned off when the second switch signal SW2 is low. The second AD conversion circuit 102 makes a conversion operation when the third clock signal CLK3 is high, and makes an auto-zero operation when the third clock signal CLK3 is low.

As shown in the chart, while the second conversion unit 84 performs conversion processing for D4–D0, the first conversion unit 82 simultaneously performs conversion processing for D9–D5 corresponding to an input analog signal Vin that is input next. Through such pipeline processing, the AD converter 10 as a whole can output a 10-bit digital value at the rate of once per period with reference to the first clock signal CLK1.

As above, according to the present embodiment, analog-to-digital conversion is pipelined by the two stages of conversion units. While the first conversion unit 82, or the prior stage, is of cyclic type, the second conversion unit 84, or the subsequent stage, is the final stage of noncyclic type, having no DA conversion circuit, amplifier circuit, or subtractor circuit. Consequently, although having a two-stage configuration like the first and second embodiments, the AD converter has a smaller number of components than those configurations and is reduced in circuit area. It is also understood that the circuit area can be reduced as compared to conventional multistage pipelined AD converters in which all the stages are made of conversion units of noncyclic type. Meanwhile, since the conversion processing load is distributed between the prior and subsequent stages for simultaneous conversion processing, it is possible to improve the overall conversion processing speed as compared to conventional cyclic AD converters of single-stage configuration.

Up to this point, the present invention has been described in conjunction with the embodiments thereof. These embodiments are given solely by way of illustration. It will be understood by those skilled in the art that various modified examples may be made of combinations of the foregoing components and processes, and all such modified examples are also intended to fall within the scope of the present invention. The following provides some of the modified examples.

In the embodiments, the subtractor circuits and the amplifier circuits which amplify the outputs thereof are provided separately. In a modified example, these circuits may be integrated as subtracting amplifiers.

In the embodiments, the parameters including the numbers of bits to be converted by the AD conversion circuits, the allocation thereof, the gains of the amplifier circuits, the clock frequencies, and the conversion speeds are shown solely by way of example. In a modified example, other figures may be employed for these parameters. Moreover, the embodiments have dealt with the cases where the AD converter consists of two stages of conversion units. In a modified example, three or more stages of conversion units may be used.

What is claimed is:

1. An analog-to-digital converter comprising a plurality of stages of conversion units each including: an AD conversion circuit which converts an input analog signal into a predetermined number of bits of digital value; a DA conversion circuit which converts the output of the AD conversion circuit into an analog signal; and a subtractor circuit which subtracts the output of the DA conversion circuit from the input analog signal, the plurality of stages of conversion units processing analog-to-digital conversion in respective predetermined bits in succession, wherein at least part of the plurality of stages of conversion units further include a circuit which feeds back the output of the subtractor circuit to the input of the AD conversion circuit, and repeat the feedback-based cyclic processing a predetermined number of times, and while the part of the stages convert a first input analog signal, the other of the stages convert a second input signal input at different timing, wherein the plurality of stages of conversion units each include a circuit which feeds back the output of the subtractor circuit to the input of the AD conversion circuit.

2. The analog-to-digital converter according to claim 1, wherein among the plurality of stages of conversion units, part of the stages including the circuit which feeds back repeat the cyclic processing a predetermined times while the other of the stages including the circuit which feeds back repeat the cyclic processing a different number of times.

3. The analog-to-digital converter according to claim 1, wherein part of the stages perform the conversion at a predetermined speed while the other of the stages perform the conversion at a different speed.

4. The analog-to-digital converter according to claim 2, wherein part of the stages perform the conversion at a predetermined speed while the other of the stages perform the conversion at a different speed.

5. The analog-to-digital converter according to claim 3, wherein among the plurality of stages of conversion units, a stage which converts a lower bit performs the conversion at a speed higher than that of a stage which converts an upper bit.

6. The analog-to-digital converter according to claim 4, wherein among the plurality of stages of conversion units, a stage which converts a lower bit performs the conversion at a speed higher than that of a stage which converts an upper bit.

* * * * *